United States Patent
Hshieh et al.

(10) Patent No.: US 6,404,025 B1
(45) Date of Patent: *Jun. 11, 2002

(54) MOSFET POWER DEVICE MANUFACTURED WITH REDUCED NUMBER OF MASKS BY FABRICATION SIMPLIFIED PROCESSES

(75) Inventors: Fwu-Iuan Hshieh, Saratoga; Yan Man Tsui, Union City, both of CA (US)

(73) Assignee: MAGEPOWER Semiconductor Corp., San Francisco, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/942,885

(22) Filed: Oct. 2, 1997

(51) Int. Cl.$^7$ .......................... H01L 29/76; H01L 29/94; H01L 31/062; H01L 31/113
(52) U.S. Cl. ..................... 257/409; 257/339; 257/488
(58) Field of Search ................. 257/329, 341, 257/339, 409, 483, 488, 484, 401; 438/414, 428, 438

(56) References Cited

U.S. PATENT DOCUMENTS

| | | | | |
|---|---|---|---|---|
| 4,532,534 A | * | 7/1985 | Ford et al. .................. | 257/341 |
| 4,879,255 A | * | 11/1989 | Deguchi et al. ............ | 438/207 |
| 5,404,040 A | * | 4/1995 | Hshieh et al. .............. | 257/341 |
| 5,798,550 A | * | 8/1998 | Kuroyanagi et al. ........ | 257/341 |
| 5,905,289 A | * | 5/1999 | Lee .............................. | 257/368 |

* cited by examiner

Primary Examiner—Tom Thomas
Assistant Examiner—Shouxiang Hu
(74) Attorney, Agent, or Firm—Bo-In Lin

(57) ABSTRACT

This invention discloses a semiconductor substrate supports a semiconductor power device. The semiconductor substrate includes a plurality of polysilicon segments disposed over a gate oxide layer including two outermost segments and inner segments wherein each of the inner segments functioning as a gate and the two outermost segments functioning as a field pate and an equal potential ring separated by an oxide-plug gap having an aspect ratio greater or equal to 0.5. Each of the inner segments functioning as a gate having a side wall spacer surrounding edges of the inner segments, and the oxide plug gap being filled with an oxide plug for separating the field plate from the equal potential ring. A plurality of power transistor cells disposed in the substrate for each of the gates covered by an overlying insulation layer having a plurality of contact openings defined therein. A plurality of metal segments covering the overlying insulation layer and being in electric contact with the power transistor cells through the contact openings. A plurality of deep-and-narrow gaps between the metal segments wherein each gap having an aspect ratio equal or greater than 0.5. A passivation layer disposed in the deep-and-narrow gaps between the metal segments having a thickness substantially the same as the metal segments for blocking mobile ions from entering into the power transistor cells.

3 Claims, 9 Drawing Sheets

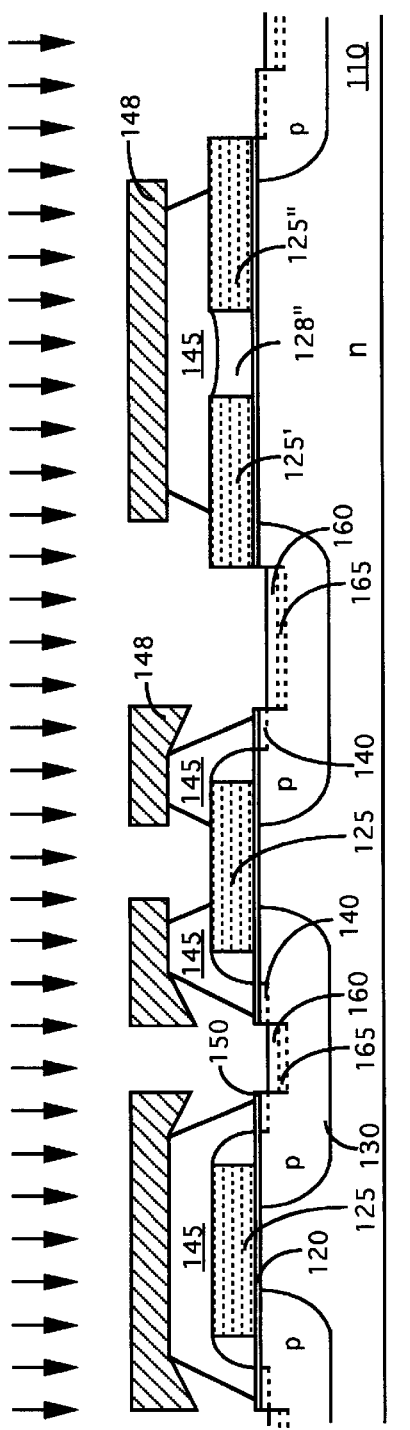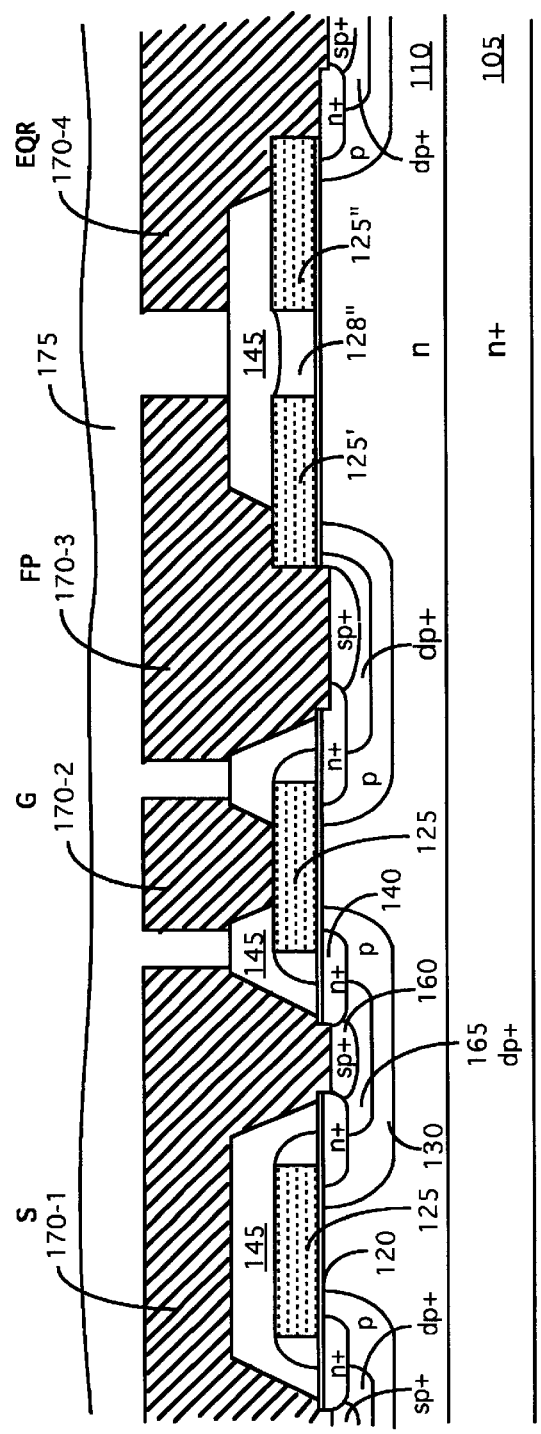

US 6,404,025 B1

MOSFET POWER DEVICE MANUFACTURED WITH REDUCED NUMBER OF MASKS BY FABRICATION SIMPLIFIED PROCESSES

BACKGROUND OF THE INVENTION

1. Field of the Invention

This invention relates generally to the structure and fabrication process of MOSFET power devices. More particularly, this invention relates to a novel and improved MOSFET device structure and fabrication process wherein reduced number of masks are employed such that MOSFET power devices can be manufactured with simplified method at lower cost while the device reliability is improved.

2. Description of the Prior Art

The goal of reducing the production cost of the MOSFET power device cannot be easily achieved. This is particularly true when the power MOSFET devices become more complicate both in cell structure and in device topology. It causes the fabrication processes to become more complex which typically requires application of increased number of masks. Longer manufacture time cycles are required which leads to higher production costs. Increased number of masks employed in the fabrication processes introduces further concerns. As more masks and processing steps are applied, more uncertainties of production yield and product reliability are introduced. The production costs are further impacted due to these undesirable factors. For these reasons, many technical improvements are attempted to reduce the number of masks employed for MOSFET fabrication.

In U.S. Pat. No. 5,404,040 entitled "Structure and Fabrication of Power MOSFETS including Termination Structures" (issued on Apr. 4, 1994), Hshieh etl al. disclose a power MOSFET, as that shown in FIG. 1. The MOSFET is manufactured by a five mask process on a semiconductor body 2000 and 2001. A first insulating layer 2002 lies over the active and termination areas. A main polysilicon portion, 2003C and 2003B, lies over the first insulating layer largely above the active area. Also a first and second peripheral polysilicon segments 2003C1 and 2003C2 lie over the first insulating layer above the termination area which are etched as two separated segments with a separating gap 2013E. A gate electrode 2016 contacts the main polysilicon potion. A source electrode 2015A and 2015B, is formed to contact the active area, the termination area and the first polysilicon segment 2003C1 through an opening in the second insulating layer 2012. The second polysilicon segment 2003C2 extends over a scribe line section of the termination area where the semiconductor is cut into separate dice. In this termination area, a metal portion is formed to contact this second polysilicon segment During a dicing process, the second polysilicon segment and the metal portion are electrically shorted to the semiconductor body. The metal portion in combination of the second polysilicon segment are useful to equalize the potential at the outer peripheral of the MOSFET and reduces the likelihood of device malfunction.

The MOSFET as that shown in FIG. 1 presents several difficulties in the fabrication processes. Specifically, it is difficult to remove a silicon segment to form the gap 2013E for separating the first polysilicon segment 2003C1 from the second polysilicon segment 2013C2. If the gap 2013E is a small gap, then a wet etch process is not suitable due to its difficulties in controlling the etching dimensions. On the other hand, if a dry etch is applied in order to make the gap 2013E with a small gap-width, then the opening surface may be damaged as a result of dry etch process. In addition to the difficulties in manufacture, the structure in the termination area presents further difficulties and limitations. Due to the opening of this gap 2013E, a passivation layer is required to prevent mobile ions from entering into the device. As will be further discussed below, a requirement of applying a pad mask to define the passivation layer is necessary which results in more complicate manufacture processes and higher MOSFET production cost Additionally, this configuration in the termination area causes a walk out phenomenon of the breakdown voltage. A more detail technical description will be provided below when a novel structural feature of this invention is disclosed to improve the termination configuration in order to resolve the walkout problems.

The number of masks required in DMOS fabrication generally is closely related to the structure of a MOSFET transistor, and particularly the requirement to apply a pad mask is related to its requirement to have a passivation layer. Please refer to FIGS. 2A and 2B respectively for a cross sectional view of a conventional planar and trenched device structure for a DMOS transistor 10. The DMOS transistor 10 is supported on a N+ substrate 15 and an N− epi-taxial layer 20 formed on its top. The cell 10 includes a p-body region 25 surrounding a source region 30 wherein the source region 30 and the p-body region 25 formed in the substrate and partially covered under a gate 40. The body-region 25 and the source region 30 are insulated from the gate 40 by a gate oxide layer 35. The DMOS cell 10 is then covered with a PSG or BPSG protection layer 45. A contact mask is then applied to open contact areas. The metal layer 50 is deposited on top of the device which is then etched by applying a metal mask to define the source metal 50-1, the gate metal 50-2, the field plate 50-3 and an equal protection ring (EQR) 50-4. After defining the metal segments 50-1 to 50-4, due to the requirement to prevent mobile ions from entering into the device between the gaps of these metal contacts, e.g., gap-A, gap-B, and gap-C as that shown in FIG. 1, a passivation layer typical comprising a PSG, a silicon nitride or an oxynitride layer has to be formed. The passivation layer 60 is then deposited and etched by the use of a pad mask to expose the areas above the source metal 50-1 and gate metal 50-2. The gaps between the metal segments, i.e., gap-A, gap-B, and gap-C, are now covered by the passivation layer 60. The metal ions are blocked by either the metal segments 50-1 to 50-4, or by the passivation layer and prevented from entering into the device.

Disadvantages of the foregoing process is that it requires additional manufacture processes and time due to the application of a pad mask for removing the passivation layer 60 from the areas above the source metal 50-1 and the gate pad 50-2. Furthermore, the passivation layer typically formed with PSG, silicon nitride, or oxynitride, having a thickness ranging from 0.5 to 1.5 micrometers. Under a very heavy contamination situation, the thickness of the passivation layer may not be sufficient to block the mobile ions from entering into the transistor cells. As these metal segments 50-1 to 50-4 are defined usually by employing a wet etching process, the gaps between the metal segments typically have a large lateral distance of approximately 15–20 micrometers because of the undercut. With such large gaps between the metal segments, the passivation layer in the gaps can only be formed in conformity with the layer profile and thus having the same thickness as the passivation layer deposited in other areas. The thickness of the passivation layer covering the gaps between the metal segments is thus mostly limited to be about the same as passivation layer formed else where. With a thickness limitation described above and the fact that the passivation layer cannot reliably protect the DMOS device from invasion of mobile ions, the reliability of a DMOS device cannot be assured. The traditional wet etching process typically performed for patterning the metal layer to produce large lateral gaps between the metal segments in a conventional DMOS device thus leads to this technical difficulty.

Therefore, there is still a need in the art of power device fabrication, particularly for DMOS design and fabrication, to provide a structure and fabrication process that would resolve these difficulties.

SUMMARY OF THE PRESENT INVENTION

It is therefore an object of the present invention to provide a new MOSFET fabrication process and a new device structure to enable those of ordinary skill in the art of DMOS fabrication to reduce the number of masks and to improve the device reliability for mobile ion protection such that aforementioned limitations and difficulties as encountered in the prior art can be overcome.

Specifically, it is an object of the present invention to provide an improved MOSFET structure and fabrication process wherein the number of masks required for manufacturing a MOSFET power device is reduced to three masks by taking advantage of the improved structural features and by applying modern manufacture technology such that the production costs of the MOSFET can be significantly reduced.

Another object of the present invention is to provide a novel MOSFET structure and fabrication process wherein improved structure in the termination area is provided with an improved configuration of field plate such that a thick initial oxide layer is no longer needed and the requirement of applying a separate active mask specifically for defining the active area by etching away a thick initial oxide layer is eliminated such that the number of masks required to fabricate a MOSFET transistor can be reduced.

Another object of the present invention is to provide a novel MOSFET structure and fabrication process wherein improved structure in the termination area is provided with an improved configuration of field plate such that a breakdown walkout problem is resolved and the requirement of applying a separate active mask specifically for defining the active area by etching away a thick initial oxide layer is eliminated such that the number of masks required to fabricate a MOSFET transistor can be reduced while the performance of the device is improved.

Another object of the present invention is to provide an improved MOSFET fabrication structure and process wherein the requirement of applying a separate source blocking mask specifically for defining the source regions by carrying out a source implant is eliminated while the contact resistance for the source metal is reduced by removing a top portion of the substrate by a dry etch process such that the number of masks required to fabricate a MOSFET transistor can be reduced and the resistance between the source regions and the source metal can be improved.

Another object of the present invention is to provide an improved MOSFET fabrication structure and process wherein the requirement of applying a separate pad masks specifically for defining the passivation layer to expose the areas above the source and gate metal segments are eliminated while a mobile ion blocking layer of greater thickness is provided such that the number of masks required to fabricate a MOSFET transistor can be reduced and the device reliability can be improved.

Another object of the present invention is to provide an improved MOSFET fabrication structure and process wherein a dry etch process is applied to etch the metal layer for defining various metal segments with gaps of reduced widths filled with mobile ion blocking material such that these material will remain in the gaps without being etched away during a process of etching the passivation layer thus a requirement of pad mask is eliminated.

Another object of the present invention is to provide an improved DMOS fabrication process wherein the passivation layer are formed in the a narrow and deep gaps between metal segments formed by applying a dry etch process such that thickness of the passivation layer is substantially approximate to that of metal layer and the mobile ions are effectively blocked by the passivation layer with greater thickness whereby the device reliability is improved with significantly reduced likelihood of mobile ions contamination.

Briefly, in a preferred embodiment, the present invention includes a method for fabricating a MOSFET device supported on a substrate. The method includes the steps of (a) growing an oxide layer on the substrate followed by depositing a polysilicon layer and applying a gate mask as a first mask for forming a plurality of polysilicon gates; (b) depositing a NSG layer overlying the top surface followed by applying an anisotropic dry etch for removing the NSG layer, and forming an oxide plug between the field plate and the equal potential ring (EQR) polysilicon segments and a plurality of side wall spacers around the gates;(c) implanting a body dopant followed by a body diffusion for forming body regions; (d)implanting a source dopant to form a plurality of source regions; (e)forming an overlying insulation layer covering the MOSFET device followed by applying a dry oxide etch with a contact mask as a second mask to open a plurality of contact openings there-through; (f)performing a dry silicon etch to remove a top portion of source dopant area from a central portion of each of the source regions followed by performing a wet etch to open a plurality of lateral source contact areas above the source regions; (g)performing a low energy body dopant implant and a high energy body dopant implant to form a shallow high concentration body dopant region and a deep high concentration body dopant region in the body regions then removing the contact mask; (h) performing a high temperature reflow process for the overlying insulation layer and for driving the source regions and the shallow and deep high concentration body dopant regions into designed junction depths; (i) depositing a metal layer followed by applying a metal mask as a third mask for patterning the metal layer to define a plurality of metal segments by employing an anisotropic dry etch thus defining a plurality of deep-and-narrow gaps between the metal segments wherein each gap having an aspect ratio equal or greater than 0.5; (j) depositing a passivation layer over an entire top surface and filling the deep-and-narrow gaps between the metal segments; and (k) etching away the passivation layer over the entire top surface without applying a mask while leaving the passivation layer inside the deep-and-narrow gaps substantially intact for serving a function of blocking mobile ions from entering into the MOSFET device whereby the MOSFET device is manufactured with a three-mask process.

These and other objects and advantages of the present invention will no doubt become obvious to those of ordinary skill in the art after having read the following detailed description of the preferred embodiment which is illustrated in the various drawing figures.

BRIEF DESCRIPTION OF THE DRAWINGS

FIGS. 3A to 3G show the processing steps for manufacturing a planar DMOS device of the present invention;

DETAILED DESCRIPTION OF THE PREFERRED EMBODIMENT

Figure 1:
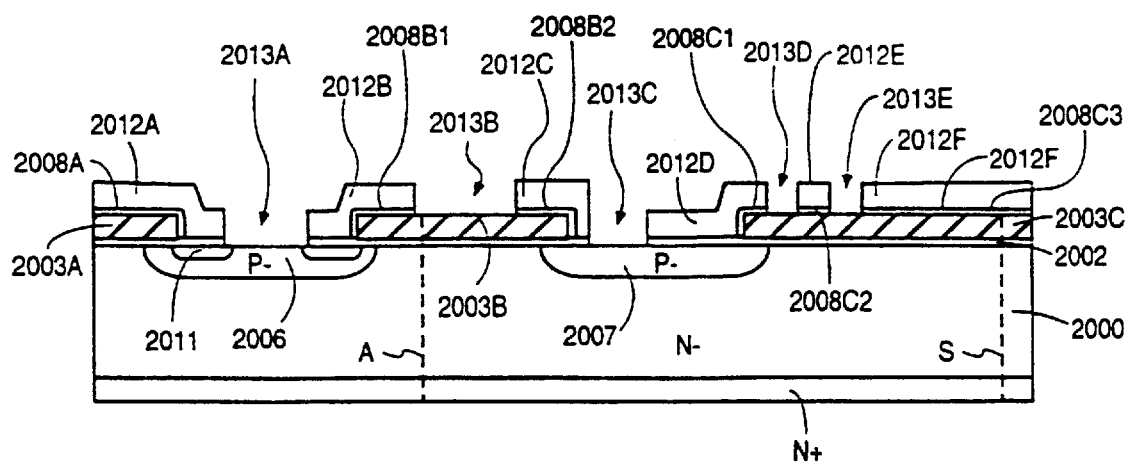
FIG. 1A is cross sectional view of a prior art MOSFET device manufactured with a five mask process with an improved termination structure.
Figure 2A:
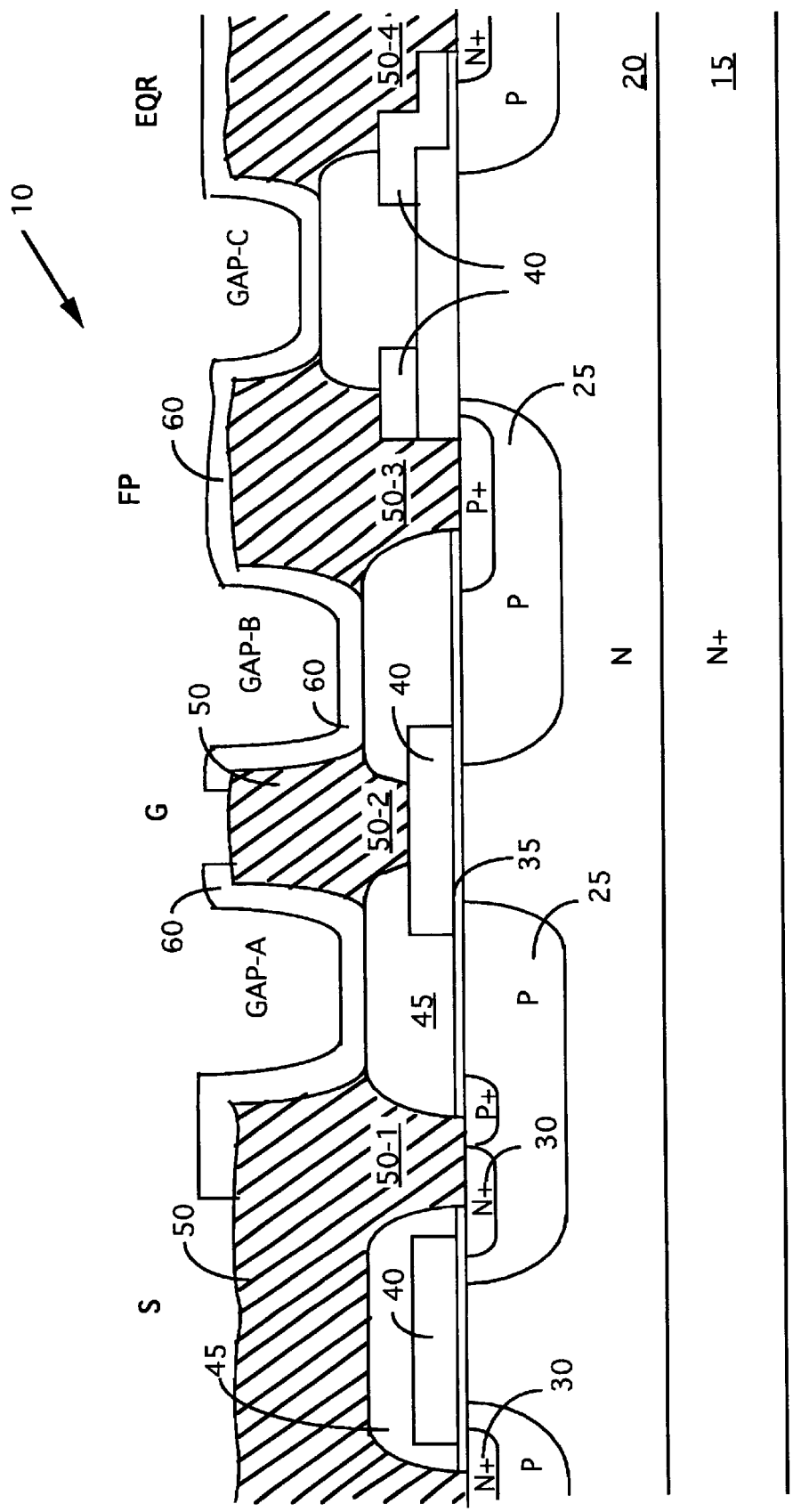
FIGS. 2A and 2B are a cross-sectional views of a prior art planar and trenched DMOS device structure respectively.
Figure 2B:
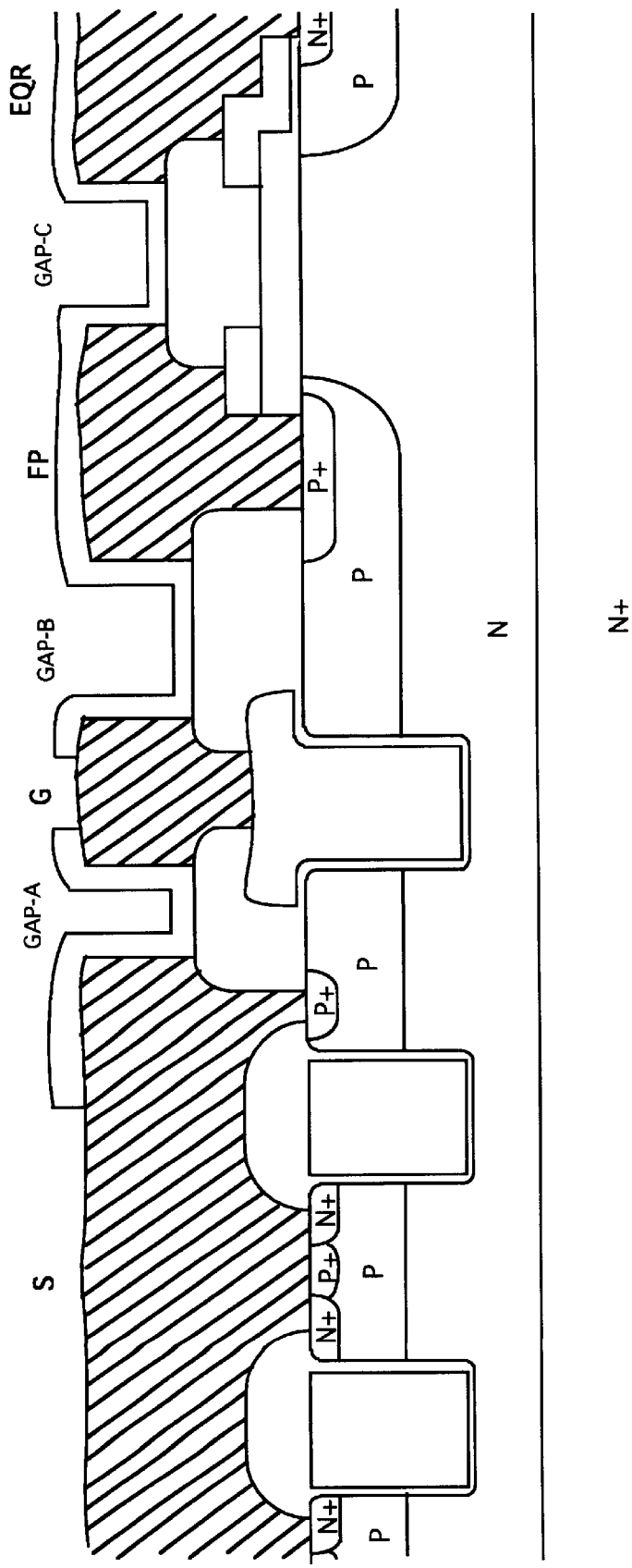
Figure 3A:
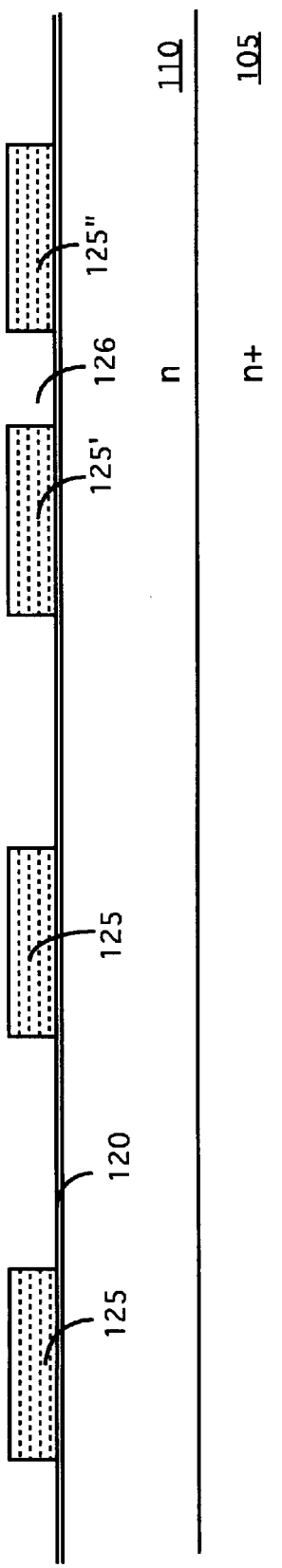
Figure 3B:
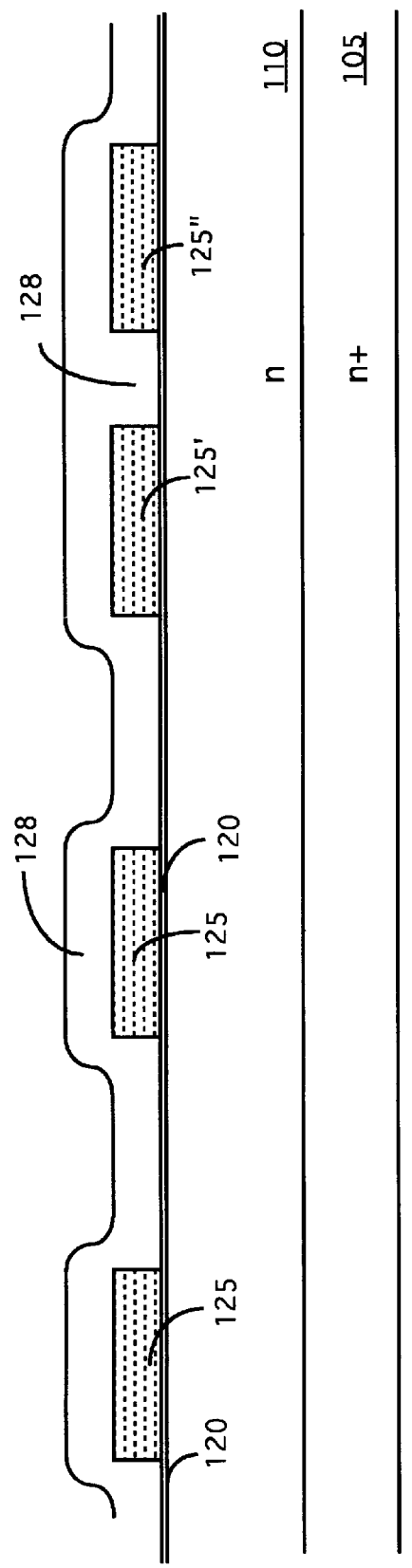

A novel MOSFET fabrication process is disclosed in this invention wherein a three-mask process is employed to significantly simplify the manufacture processes. Referring to FIGS. 3A to 3G for the processing steps in manufacturing the MOSFET device 100. As shown in FIG. 3A, the processing steps begins by first growing a N⁻ epitaxial layer 110 with a resistivity ranging from 0.1 to 10 ohm-cm on top of a N+ substrate 105. The substrate has a resistivity of 0.001 to 0.02 ohm-cm. The thickness and the resistivity of the epitaxial layer 110 depend on the requirements for the on-resistance and breakdown voltage. In a preferred embodiment, the thickness of the epi-layer 110 is about six to eight microns. A gate oxide layer 120 of thickness in the range of 100 to 1000 Angstroms is grown. A polysilicon layer 125 having a thickness of approximately 3000 to 10,000 Angstroms is then deposited. A $POCL_3$ doping process is carried out followed by an arsenic (As) implant process with an ion beam of energy at 60–80 Kev with a flux density in the range between 5 to $8\times10^{15}/cm^2$. A polysilicon mask, i.e.; the first mask, is applied to carry out the an anisotropic etching process to define the polysilicon gate 125. It should also be noticed that a segment 125' and 125" of the polysilicon on the peripheral portion provided to form the field plate and equal potential ring (EQR) are defined to have a narrow gap 126 of about 0.5 to 2.0 micrometers in gap width. Referring to FIG. 3B, a NSG layer 128 of 0.5 to 1.0 micrometer in thickness is deposited. For the narrow gap 126 between the polysilicon segments 125' and 125", since the aspect ratio, i.e., the ratio of the width to the depth of the gap 126, is equal or greater than 0.5, the NSG layer 128 fills the gap 126 without a significant dip caused by the variations of height across gap 126 and the top surface is approximately a flat surface.

Figure 3C:
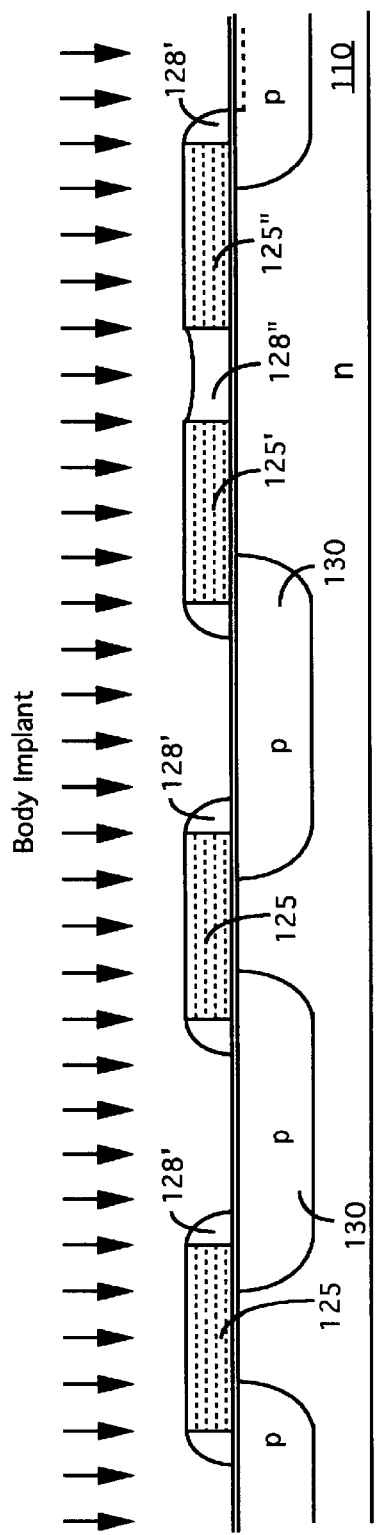

Referring to FIG. 3C, an an-isotropic dry etch process is performed to remove the entire NSG layer 128 except the side-wall spacers 128' around the edges of the polysilicon gates 125. Also, the NSG layer 128 filling the gap 126 functioning as an oxide plug 128" remains substantially intact except a very thin layer is removed from the top of the gap 126. Thus the oxide plug 128" filling the gap 126 basically has a same thickness as the polysilicon layer 125' and 125". The oxide plug 128" formed in the gap 126 is used to block subsequent p-body implant from entering into the silicon layer underneath the oxide plug. A potential problem arising from a low breakdown voltage when additional body dopant region is formed between the field plate and the equal protection ring (EQR) is therefore eliminated. The oxide plug 128" formed in the gap 126 therefore provides the advantage that an initial oxide layer commonly used to prevent a body dopant region from being implanted between the field plate and the EQR is no longer required and thus removing a mask requirement for defining the initial oxide areas. A p-body implant at 30–80 Kev with an ion beam of $3\times10^{13}$ to $3\times10^{14}/cm^2$ flux density is applied to implant the p-body regions 130. The oxide plug in the gap 126 between the field plate and the EQR thus blocks the p-body dopant from entering the substrate. A p-body diffusion process is then carried out at an elevated temperature of 1,000–1,200° C. for ten minutes to three hours to increase the depth of the p-body region 130 to 1.0–6.0 μm.

Figure 3D:
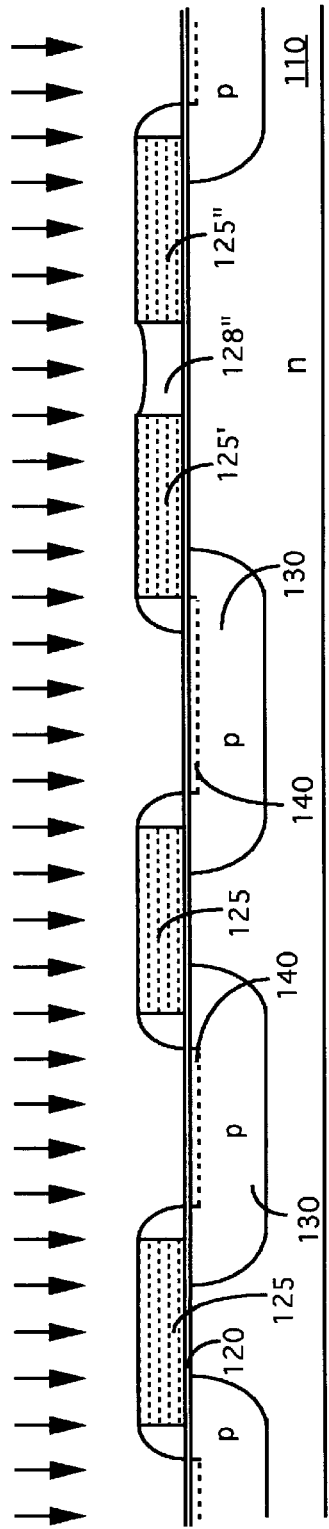

Referring to FIG. 3D, a source implant is carried out with a source ion beam of either a phosphorus ions at an energy of 60–100 Kev and ion flux density of $5\times10^{15}$ to $1\times10^{16}/cm^2$ or an arsenic ions at an energy of 60–150 Kev and ion flux density of $1\times10^{15}$ to $1\times10^{16}/cm^2$ to form the source regions 140. In FIG. 3E, a BPSG or PSG is deposited to form an insulation layer 145 of approximately 5000–15,000 Å in thickness. A contact mask 148 is applied to first perform a dry etch to etch the insulation layer 145 to define a plurality of contact windows 150. A silicon etch is performed to remove a top layer of the silicon doped with source implant ions. A wet etch is then performed to open the lateral n+ contact areas 150. A thin layer of about 500–1000 Angstroms from the top layer of the silicon is removed by the silicon etch. A shallow body implant is performed to form a shallow high concentration body region 160 with either a low energy boron implant with an ion flux of $1\times10^{14}$ to $2\times10^{15}/cm^2$ at about 20 to 60 Kev or a high energy $BF_2$ implant with an ion flux of $1\times10^{14}/cm^2$ to $2\times10^{15}$ at about 100–240 Kev. Then a high energy body implant is carried out by either skipping a step of growing an implant oxide layer or implanting with an implant angle smaller than seven degree (7°), e.g., at zero degree relative to the perpendicular direction to the top surface of the substrate, to form a deep high concentration body region 165 with 175-1 to 175-3. These deep and narrow gaps have an aspect ratio equal or greater than 0.5 wherein the aspect ratio is defined as:

Gap Aspect Ratio=(Depth of Gap)/(Gap Lateral Width)   (1)

For gaps 175-1 to 175-3:

Aspect Ratio of Gaps≧0.5   (2)

The gap width of about one to four micrometers and a depth of about three to five micrometers. The depth of the gaps 175-1 to 175-3 is essentially the same as the thickness of the metal contact layer 170. A passivation layer composed of mobile ion blocking materials such as PSG, nitride or oxyin nitride ($Si_xN_yO_z$) or combination of PSG and nitride, is deposited over the entire top surface of the device. With the gap aspect ratio equal or greater than 0.5, the mobile ion blocking material also fill up the deep and narrow gaps 175-1 to 175-3 between the metal segments.

Figure 3G:
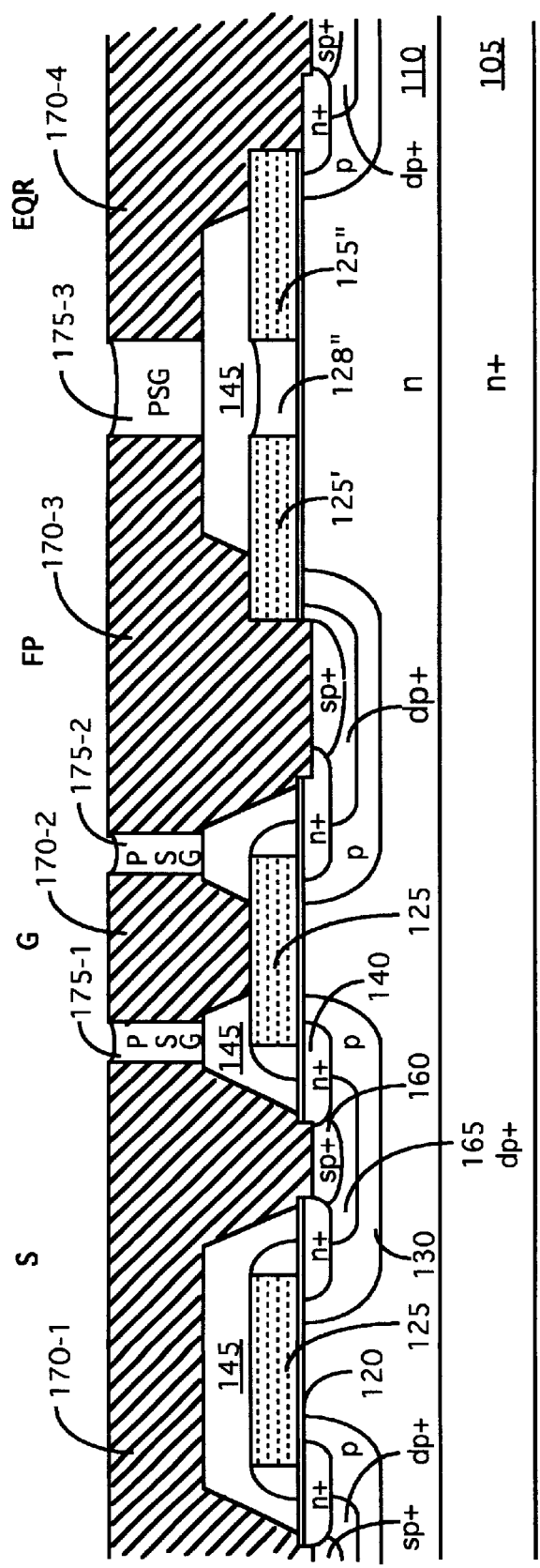

Referring to FIG. 3G, a dry etching process is performed without applying a pad mask to remove the entire layer of the passivation material from the top surface. In dry etching the top layer away, only a small portion from the top of the mobile ion blocking material filled in the between-the-contact gaps 175-1 to 175-3 is removed while the major portions of the filling material in these deep and narrow gaps 175-1 to 175-3 composed of mobile ion blocking material are kept intact.

Figure 4:
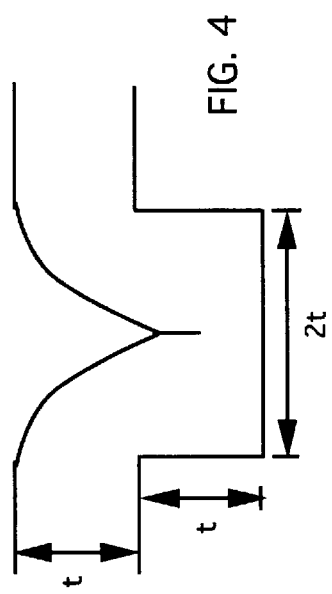
FIG. 4 the filling of a deep and narrow gap when an aspect ratio is equal or greater than 0.5.

FIG. 4 is a cross section view for one of the deep and narrow gaps 175-1 to 175-3 with aspect ratio equal to 0.5. When a passivation layer with a layer thickness T is deposited over the top surface, the gap which has an aspect ratio of 0.5, i.e., has a lateral gap width of 2T, is filled up with the passivation layer because the layer has a thickness T and the gap width is 2T. By controlling the aspect ratio of the gaps 175-1 to 175-3, a thick passivation layer which is almost as thick as the metal layer can be formed.

Figure 5A:
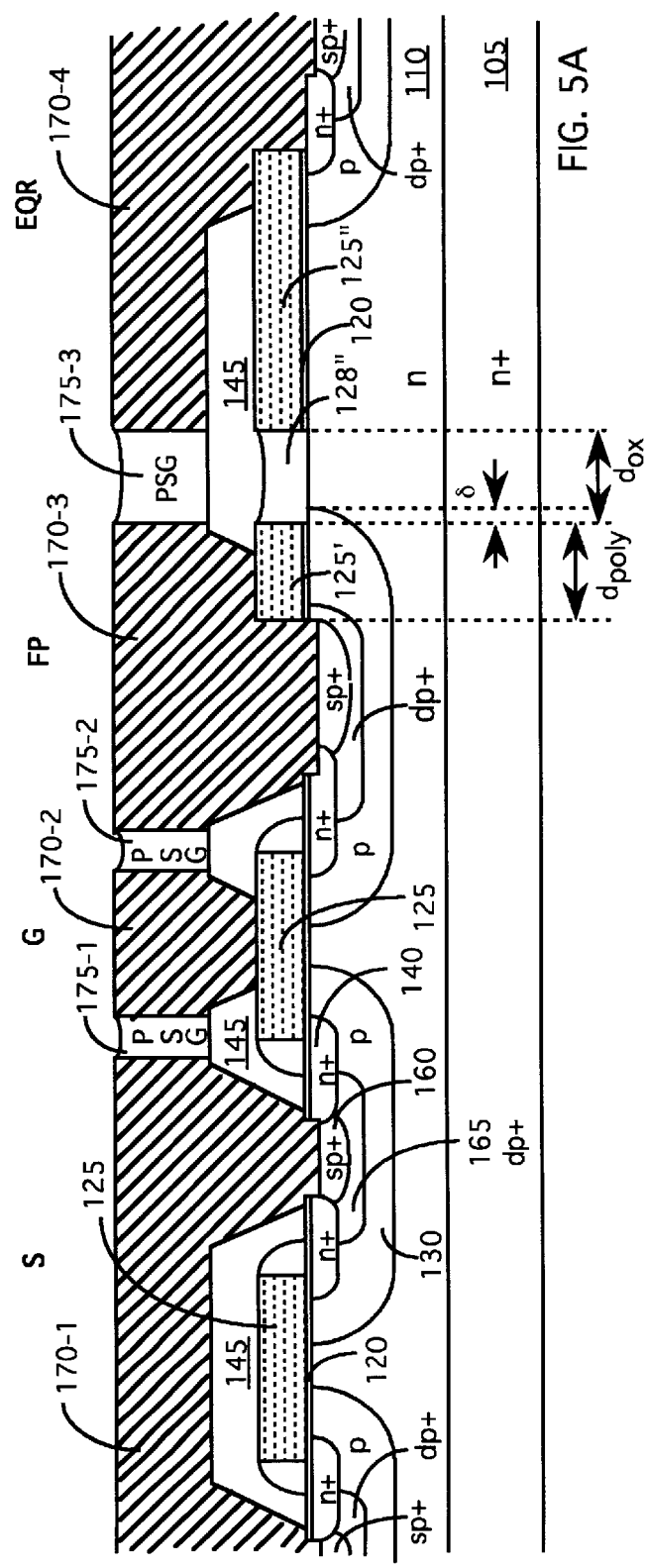
FIGS. 5A and 5B show the cross sectional views of two alternate preferred embodiment showing respectively a planar and a trenched MOSFET devices of the present invention.

Referring to FIG. 5A for a planar MOSFET power device 100' with structural features manufactured by applying the processing steps described above. The MOSFET power device 100' further provides a special structural feature in the termination area to avoid a breakdown walkout problem. Specifically, when applying a polysilicon mask to etch the polysilicon layer, the inner segment 125' is formed to have a segment $D_{poly}$ where the segment width is less than the lateral diffusion length of the body dopant $D_L$, i.e., $$D_{poly} < D_L \quad (3)$$

By making the segment width $D_{poly}$ less than the lateral diffusion length of the body dopant $D_L$, the p-body region 130 would then extend beyond the outer edge of the segment 125'. The distance which the p-body extends beyond the polysilicon segment 125' is represented by δ and $$\delta > 0 \quad (4)$$

In this preferred embodiment, the gap between the field plate 125' and the EQR 125" now filled with an oxide plug 128" has a special width of approximately 0.5 to 2.0 micrometers, the segment width of the segment 125' is about 0.5–1.0 micrometer. Compared to prior art process, the fabrication process of this invention has the advantage the dimension of the gap width can be controlled with high precision when the polysilicon mask is applied. In contrast, in the prior art, the width of this segment cannot be easily controlled due to a greater alignment imprecision over thick layer of metal for etching and removing the gap, i.e., gap 2013E of Hshieh's prior art device.

According to FIGS. 3A to 5 and the above description, this invention discloses a method for fabricating a MOSFET device supported on a substrate 105. The method includes the steps of (a) growing an oxide layer 120 on the substrate followed by depositing a polysilicon layer 125 and applying a gate mask as a first mask for forming a plurality of polysilicon gates 125; (b) depositing a NSG layer 128 overlying the top surface followed by applying an anisotropic dry etch for removing the NSG layer 128 and forming a plurality of side wall spacers 128' around the gates 125 and forming an oxide plug 128" filling the gap between the field plate 125' and the EQR ring 125"; (c) implanting a body dopant followed by a body diffusion for forming body regions 130; (d) implanting a source dopant to form a plurality of source regions 140; (e) forming an overlying insulation layer 145 covering the MOSFET device followed by applying a dry etch with a contact mask 148 as a second mask to open a plurality of contact openings therethrough; (f) performing a silicon etch to remove a top portion of a source dopant area from a central portion of each of the source regions 140 followed by performing a wet etch to open a plurality of lateral source contact areas 150 above the source regions; (g) performing a low energy body dopant implant and a high energy body dopant implant to form a shallow high concentration body dopant region 160 and a deep high concentration body dopant region 165 in the body regions 130 then removing the contact mask 148; (h) performing a high temperature reflow process for the overlying insulation layer 145 and for driving the source regions 140 and the shallow and deep high concentration body dopant regions 160 and 165 into designed junction depths; (i) depositing a metal layer 170 followed by applying a metal mask as a third mask for patterning the metal layer to define a plurality of metal segments 170-1 to 170-4 by employing an anisotropic dry etch thus defining a plurality of deep-and-narrow gaps 175-1 to 175-3 between the metal segments 170-1 to 170-4 wherein each gap having an aspect ratio equal or greater than 0.5; (j) depositing a passivation layer 175' over an entire top surface and filling the deep-and-narrow gaps between the metal segments; and (k) etching away the passivation layer over the entire top surface without applying a mask while leaving the passivation layer inside the deep-and-narrow gaps 175-1 to 175-3 substantially intact for serving a function of blocking mobile ions from entering into the MOSFET device whereby the MOSFET device is manufactured with a three-mask process.

In a preferred embodiment, the step (a) of applying a gate mask for forming a plurality of polysilicon gates includes a step of etching the polysilicon layer in a termination area into an inner segment and an outer segments wherein the inner segment having a width less than a lateral diffusion of the body dopant; and the step of forming the inner segment and the outer segment is a step of etching a polysilicon gap between the inner and the outer segments having an aspect ratio equal or greater than 0.5. In another preferred embodiment, the step (b) of depositing a NSG layer 148 overlying the top surface is a step of filling the polysilicon gap 126; and the step of applying an anisotropic dry etch for removing the NSG layer is a step of removing the NSG layer above the polysilicon gap while leaving the NSG layer as an oxide plug 128" in the polysilicon gap 126 substantially intact. In another preferred embodiment, the step (a) of etching the polysilicon gap between the inner and outer segments 125' and 125" is a step of dry etching the polysilicon gap 126 with width substantially between 0.5 to 4.0 micrometers. In yet another preferred embodiment, the step (i) of employing an anisotropic dry etch for defining a plurality of deep-and-narrow gaps between the metal segments is a step of etching the deep-and-narrow gaps between the metal segments substantially having a width of approximately one to four micrometers. In another preferred embodiment, the step (j) of depositing a passivation layer 175 over an entire top surface and filing the deep-and-narrow gaps between the metal segments is a step of depositing a mobile ion blocking layer of PSG over the top surface and filling the deep-and-narrow gaps. In another preferred embodiment, the step (i) of depositing a passivation layer over an entire top surface and filling the deep-and-narrow gaps between the metal segments is a step of depositing a mobile ion blocking layer of silicon nitride over the top surface and filling the deep-and-narrow gaps. In another preferred embodiment, the step (i) of depositing a passivation layer over an entire top surface and filling the deep-and-narrow gaps between the metal segments is a step of depositing a mobile ion blocking layer of oxynitride over the top surface and filling the deep-and-narrow gaps. In another preferred embodiment, the step (i) of depositing a metal layer to form electric contacts through the contact openings further comprising a step of controlling a thickness of the metal layer for controlling a depth of the deep-and-narrow gaps between the metal segments.

Figure 5B:
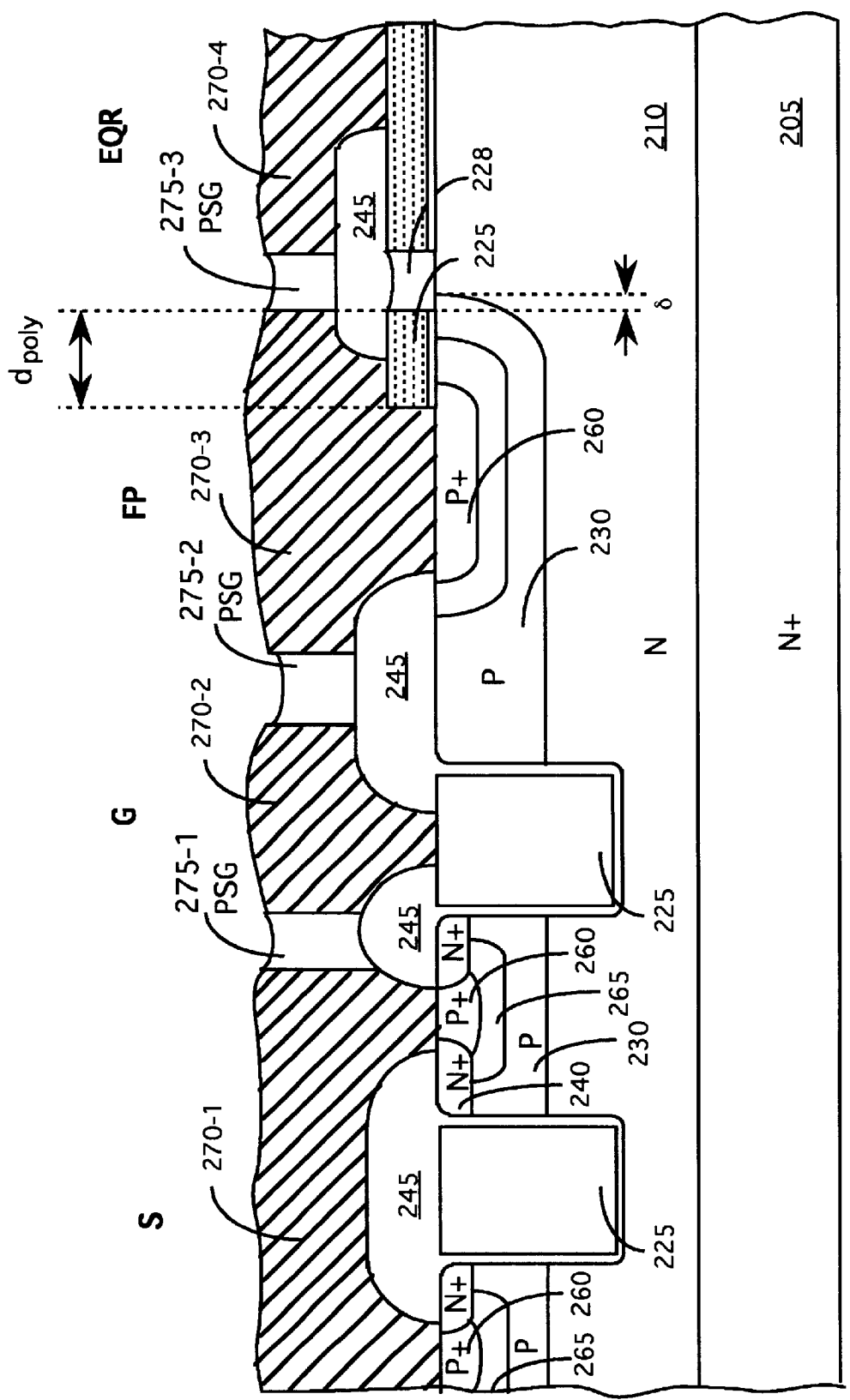

Referring to FIG. 5B for a trenched MOSFET power device 200 with structural features manufactured by applying the processing steps similar to that employed for a planar device 100' described above. The trenched MOSFET power device 200 also includes an oxide plug 228 filling the gap between the field plate 225' and the EQR ring 225" such that an initial oxide mask for defining the active area is not required. The device 200 also provides a similar structural feature in the termination area to avoid a breakdown walkout problem. Specifically, when applying a polysilicon mask to etch the polysilicon layer, the inner segment 225' is formed to have a segment $D_{poly}$ where the segment width is less than the lateral diffusion length of the body dopant $D_L$, as that shown in Equation (3). By making the segment width $D_{poly}$ less than the lateral diffusion length of the body dopant $D_L$, the p-body region 230 would then extend beyond the outer edge of the segment 225'. The distance which the p-body extends beyond the polysilicon segment 225' is represented by δ and δ>0 according to Equation (4). The gap between the field plate 225' and the EQR 225" now filled with an oxide plug 228" has a width of approximately 0.5 to 2.0 micrometers, the segment width of the segment 225' is about 0.5–1.0 micrometer.

Therefore, the present invention provides a new MOSFET fabrication process and a new device structure to enable those of ordinary skill in the art of MOSFET fabrication to reduce the number of masks and to improve the device reliability for mobile ion protection such that the limitations and difficulties as encountered in the prior art can be overcome. Specifically, the present invention provides an improved MOSFET structure and fabrication process to reduce the number of masks required for manufacturing a MOSFET power device to three masks by taking advantage of the improved structural features and by applying modern manufacture technology such that the production costs of the MOSFET can be significantly reduced. An improved structure in the termination area is provided with an improved field plate with an oxide plug filling the gap between the filed plate and the EQR ring such that a thick initial oxide layer is no longer needed and the requirement of applying a separate active mask specifically for defining the active area by etching away a thick initial oxide layer is eliminated such that the number of masks required to fabricate a MOSFET transistor can be reduced. The improved structure in the termination area with an improved equal potential ring also provide a solution to a breakdown voltage walkout problem. Also, the requirement of applying a separate source blocking mask specifically for defining the source regions by carrying out a source implant is eliminated while the contact resistance for the source metal is reduced by removing a top portion of the substrate by a wet etch process such that the number of masks required to fabricate a MOSFET transistor can be reduced without a source blocking mask and the resistance between the source regions and the source metal can be improved. Additionally, a requirement of applying a separate pad masks specifically for defining the passivation layer to expose the areas above the source and gate metal segments are eliminated while a mobile ion blocking layer of greater thickness is provided such that the number of masks required to fabricate a MOSFET transistor can be reduced and the device reliability can be improved.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, wit is intended that the appended claims be interpreted as covering all alternations and modifications as fall within the true spirit and scope of the invention.

We claim:

1. A MOSFET power device supported on a substrate comprising:

a plurality of polysilicon segments disposed over a gate oxide layer including two outermost segments and a plurality of inner segments wherein each of said inner segments functioning as a gate and said two outermost segments functioning as a field plate and an equal potential ring separated by an oxide-plug gap having an aspect ratio grater or equal to 0.5;

a plurality of MOSFET transistor cells for each of said gates, wherein each transistor cells further includes a source region, a body region, said transistor cells further having a common drain disposed at a bottom surface of said substrate;

each of said inner segments functioning as a gate having a side wall spacer surrounding edges of said inner segments and an oxide-plug disposed inside said oxide plug gap having substantially a same thickness as said two outermost segments wherein said oxide plug having a concave plug-top-surface with a thin-top layer etched off for separating said filed plate from said equal potential ring;

an overlaying insulation layer covering said MOSFET transistor cells and covering said oxide plug wherein said oxide plug with said concave plug-top-surface and said insulation layer are structurally identifiable as two separate layers formed in two separate processing steps, and top surfaces of said two outermost segments adjacent to said oxide plug; and said overlaying insulation layer having a plurality of contact openings defined therein;

a plurality of metal segments covering said overlaying insulation layer and being in electric contact with said MOSFET transistor cells through said contact openings; and a plurality of deep-and-narrow gaps between said metal segments wherein each gap having an aspect ratio equal to or greater than 0.5.

2. The MOSFET power device of claim 1 further comprising:

a passivation layer disposed in said deep-and-narrow gaps between said metal segments having a thickness substantially the same as said metal segments wherein said passivation layer disposed in said deep-and-narrow gaps having a concave top-surface with a thin top layer etched off for completely etching off said passivation layer above said metal segments whereby all of said metal segments are not covered by said passivation layer and having an exposed metal top surface ready for external electric connection.

3. The MOSFET power device of claim 1 wherein:

said plurality of metal segments include a source metal, a gate metal, a field plate and an equal potential ring (EQR) separated from each other with said deep-and-narrow gaps having an aspect ratio equal to or greater than 0.5 each filled with a mobile-ion blocking passivation material having a thickness substantially as said metal segments wherein said mobile-ion blocking passivation material having a concave top surface with a thin top layer etched off for completely etching off said mobile-ion blocking passivation material for completely exposing a top surface of all of said metal segment ready for external electrical connection.

* * * * *